United States Patent [15] 3,648,154

Frederiksen et al. [45] Mar. 7, 1972

[54] POWER SUPPLY START CIRCUIT AND AMPLIFIER CIRCUIT

[72] Inventors: Thomas M. Frederiksen, Scottsdale; Ronald W. Russell, Mesa, both of Ariz.

[73] Assignee: Motorola, Inc., Fanklin Park, Ill.

[22] Filed: Dec. 10, 1970

[21] Appl. No.: 96,904

[52] U.S. Cl. ....................323/22 T, 330/69
[51] Int. Cl. ....................G05f 1/48
[58] Field of Search ....................330/20, 300, 69; 323/1, 4, 323/16, 17, 22 T

[56] References Cited

UNITED STATES PATENTS 3,250,922 5/1966 Parham ....................323/4 UX
3,417,319 12/1968 Shaughnessy ....................323/4
3,491,307 1/1970 Solomon et al. ....................330/30 D
3,077,566 2/1963 Vosteen ....................330/20 X

*Primary Examiner*—A. D. Pellinen
*Attorney*—Mueller & Aichele

[57] ABSTRACT

An operational amplifier capable of operating over a relatively wide variation of power supply voltages and temperature employs a high-beta lateral PNP buffer stage single input or dual input versions. Reference biasing voltage for operating the amplifier circuit is obtained from a current source supplying current through a string of series connected diodes, and a differential amplifier start circuit is provided in order to assure that current commences flowing through the diode string since the current source driving the string is biased from the same diode string.

15 Claims, 3 Drawing Figures

INVENTORS.
THOMAS M. FREDERIKSEN
RONALD W. RUSSELL

BY Mueller & Aichele

ATTORNEYS.

POWER SUPPLY START CIRCUIT AND AMPLIFIER CIRCUIT

BACKGROUND OF THE INVENTION

The advent of monolithic integrated circuit technology has made it possible to employ electronic circuits in many areas where previously the cost of electronic circuitry for control purposes and the like was prohibitive. One of the areas in which an increased interest in monolithic integrated circuits is presently being evidenced is in the automotive or vehicular industry, with integrated circuits being utilized for tachometer driving circuits, vehicle operation monitoring circuits, voltage regulators and the like. In order most advantageously to employ monolithic integrated circuits in the operating environment of a motor vehicle, it is necessary that the integrated circuit be capable of operation over a wide range of ambient temperatures and over a wide range of operating voltages.

Although monolithic integrated circuit operational amplifiers have been developed which are capable of operation over a relatively wide ambient temperature range, they require both a positive and a negative power supply voltage for optimum operation, and the cost of most of these circuits is prohibitive for commercial applications in automotive vehicles. As a consequence, it is desirable to provide relatively inexpensive but relatively highly temperature and voltage regulated multiple operational amplifiers on a single chip which are capable of operation with a single power supply voltage. Such an amplifier also should draw minimum current from the vehicle voltage supply in order to prevent unnecessary loading of this voltage supply. In addition, a number of applications for monolithic integrated circuits in vehicle systems require only a single input and it is desirable to provide a monolithic integrated circuit operational amplifier capable of operating with a single input, or with slight modifications capable of operating with the normal and inverting inputs commonly associated with operational amplifiers.

SUMMARY OF THE INVENTION

Accordingly, it is an object of this invention to provide an improved regulated voltage supply circuit.

It is an additional object of this invention to insure operation of an integrated voltage supply circuit upon initial application of power thereto.

It is another object of this invention to provide an improved operational amplifier.

In accordance with a preferred embodiment of this invention, a stabilized voltage supply source is provided in the form of a current source supplying current through a string of series-connected diodes, with the operation of the current source being established from a voltage across a predetermined number of the same diodes. In order to insure that current initially commences flowing through this current source, a differential startup switching circuit is employed, with a differential amplifier connected initially to bias the current source into conduction and operating as a switch to remove this initial bias and substitute a bias obtained from the diodes once the current source commences conduction and becomes self-biasing.

The stabilized voltage appearing across the diodes is supplied as an operating bias potential to an amplifier circuit including an NPN signal input transistor and an NPN output transistor, separated by a PNP buffer transistor, the emitter of which is connected to the base of the NPN output transistor and the collector of which is connected to the emitter of the output transistor. The base of the buffer transistor is connected to the collector of the input transistor. In a specific embodiment, the PNP buffer transistor is a high-beta lateral PNP transistor; and the connection between the collector of the PNP transistor and the emitter of the NPN output transistor is the sole connection to the collector of the PNP transistor.

DETAILED DESCRIPTION

Figures 1, 2, 3:
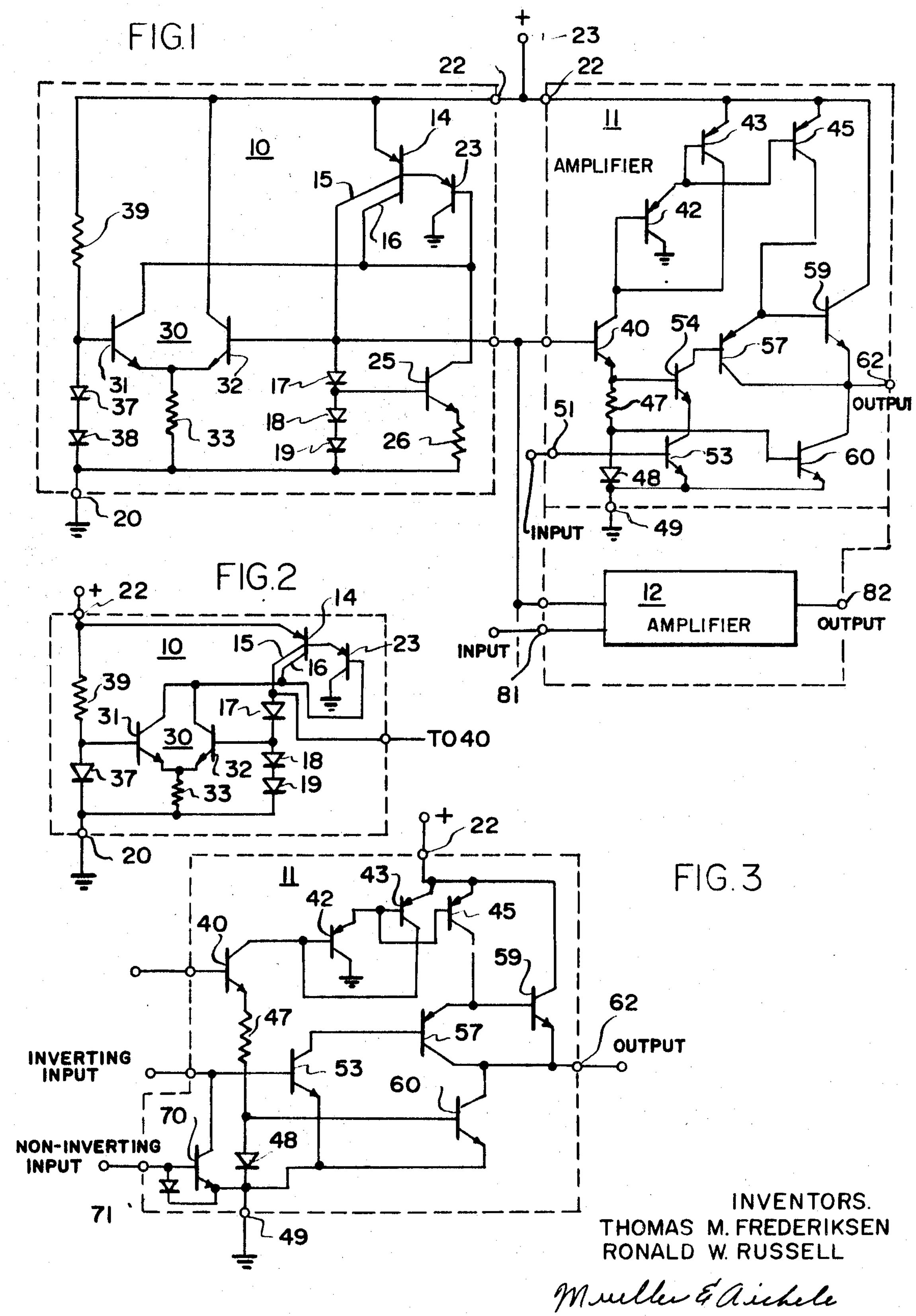
FIG. 1 is a detailed circuit diagram of a preferred embodiment of the invention.
FIGS. 2 and 3 are circuit diagrams of variations of the circuit shown in FIG. 1.

Referring now to the drawing, wherein like reference numbers are used throughout the Figures to designate the same or similar components, there is shown an operational amplifier circuit in accordance with a preferred embodiment of this invention. Since the amplifier circuit shown in the drawing is to be operated in an environment subject to relatively wide variations of DC supply or operating potential and wide variations in the ambient temperature level, it is necessary to provide for a regulation of the biasing voltages which establish the DC operating level of the operational amplifier portion of the circuit. This is accomplished by the circuit 10 shown in FIG. 1, which provides a stabilized DC output reference voltage. This reference voltage then may be utilized by a number of different operational amplifier stages, two of which 11 and 12 are indicated in the drawing, with stage 11 being indicated in detail.

The regulated voltage supplied by the circuit 10 is derived from a current source in the form of a dual collector lateral PNP transistor 14 having collectors 15 and 16, with the collector 15 connected in series with three series-connected diodes 17, 18 and 19. The cathode of the diode 19 is connected to a bonding pad 20 coupled to ground, and the emitter of the transistor 14 is connected to a bonding pad 22 which may be connected to an unregulated source of positive DC potential 23. The potential applied to the terminal 23 may vary over a wide range, such as from 3.5 volts to 40 volts.

The constant current source transistor 14, operating in conjunction with the diodes 17, 18 and 19, provides a predetermined stabilized current flow through the diodes 17, 18 and 19. These diodes may be formed as part of a monolithic integrated circuit from the emitter-base junctions of transistors having the collector-base junctions shorted. This technique for forming diodes in an integrated circuit is well known.

Operating bias for the current source transistor 14, in turn, is obtained from a substrate PNP-transistor 23, the emitter of which is connected with the base of the transistor 14 and the collector of which is coupled to ground (the substrate of the chip on which the circuit is formed). The second collector 16 of the current source transistor 14 is also connected to the base of the substrate PNP transistor 23. This connection is used to reference the current flow in the current source transistor 14 via the collector 16 thereof, as the base current of the substrate PNP transistor 23 is small. Biasing current for the collector 16 of the transistor 14 is derived from an NPN transistor 25, having the collector thereof connected to the base of the transistor 23 and the emitter coupled through a resistor 26 to the bonding pad 20. The base of the transistor 25 is provided with DC biasing potential obtained across the two diode drop ($2\phi$, where $\phi$ is the voltage drop across one diode junction) of the diodes 18 and 19.

It is apparent that when power initially is applied to the circuit shown in FIG. 1 if the current source transistor 14 does not initially conduct, the circuit will not start up and no current will flow through the diodes 17, 18 and 19. In order to prevent this from occurring, a differential amplifier switch start circuit 30, including a pair of NPN transistors 31 and 32, is utilized to insure start up of the stabilized voltage supply circuit 10. The emitters of the transistors 31 and 32 are connected together in common through an emitter resistor 33 to the bonding pad 20. The base of the transistor 32 is coupled to the junction of the collector 15 with the diode 17; and the base of the transistor 31 is provided with a $2\phi$ biasing potential obtained across a pair of diodes 37 and 38, forming part of a voltage divider in conjunction with a pinch resistor 39 connected in series between the bonding pad 22 and the bonding pad 20. When power is initially applied to the circuit at the bonding pad 22, current flows through the resistor 39 and the diodes 37 and 38. If no current flows through the PNP current source transistor 14 at this time, the transistor 31 is biased into conduction and the transistor 32 is nonconductive.

When the transistor 31 commences conduction, it extracts a current of $\phi/R_{33}$ (approximately 20 microamps) from the base of the PNP transistor 23. This in turn causes the multiple-collector PNP-transistor 14 to conduct to supply current from the collector 15 to the three-diode string 17, 18 and 19 and to the base of the NPN transistor 25. The transistor 25 then commences conduction, and the bias of this transistor is rapidly established at $\phi/R_{26}$ (200 microamps); and as a result of an area scaling between the collectors of the transistor 14, the three diode string 17, 18 and 19 is biased at approximately 400 micro-amps of current. The base current of the transistor 23 is small enough that the NPN current source transistor 25 is controlling the biasing of the multiple-collector lateral PNP transistor 14, as a result of the collector 16.

Once the biasing is established, there is no further need for the start function provided by the differential amplifier switch 30. The switch 30 is automatically disabled due to the larger input at the base of the transistor 32 ($3\phi$) of the start differential amplifier switch 30. As a consequence, after startup, the transistor 32 becomes conductive directly from the power supply applied to the bonding pad 22. This in turn causes the transistor 31 to switch off or become nonconductive, and the "start circuit" 10 no longer interferes with the normal circuit operation. So long as power continues to be applied to the bonding pad 22, a stabilized potential is established at the junction of the diode 17 with the collector 15; and this potential then may be utilized to provide the biasing or operating potential for the operational amplifier stages of the circuit.

The operating bias for the transistors 31 and 32 in the start-up differential amplifier switching circuit 30 could be provided by Zener diodes in place of the diodes 37, 38 and 17, 18, and 19 respectively. If Zener diodes are used, however, the lowest magnitude of the power supply applied to the terminal 23 necessarily would have to be higher than the lowest magnitude which can be tolerated by the use of series connected diodes 37 and 38 or 17, 18 and 19. This occurs due to the fact that the lowest valued Zener diode presently available in standard monolithic integrated circuit technology provides approximately a 5-volt drop across the Zener diode. Thus, the minimum voltage which could be applied to the terminal 23 for operation of a circuit using such Zener diodes in place of the diodes 37, 38 or 17, 18 and 19 would be something slightly in excess of 5 volts. By utilizing series-connected, base-emitter, junction diodes, however, it is possible to provide a much lower magnitude of operating potential since the forward voltage drop across a typical diode is of the order of 0.6 to 0.7 volts. As a consequence, use of such diodes permits operation of the circuit shown in FIG. 1 with a much lower power supply voltage than would be possible if Zener diodes were relied upon for the voltage regulation.

The regulated voltage established by the current source transistor from the current flowing through the collector 15 and the series connected diodes 17, 18 and 19 is provided at the junction of the collector 15 and the diode 17 or may be provided at some suitable junction between others of the diodes 17, 18 and 19, in the diode string. The number of diodes which are shown biasing each side of the differential amplifier switch 30 may be selected in accordance with the particular operating voltage level which it is desired to obtain from the circuit 10, it only being necessary that a greater number of diodes (causing a greater voltage drop) are connected between the base of the transistor 32 and ground than are connected between the base of the transistor 31 and ground when current is flowing in both of the biasing strings coupled, respectively, to the bases of these transistors.

A variation of the regulated voltage supply circuit 10 is shown in FIG. 2 in which the same or similar components are provided with the same reference numerals used in FIG. 1. In the circuit shown in FIG. 2, some of the components have been eliminated by utilizing the differential amplifier 30 to perform the dual function of the switching necessary to insure startup of the circuit and to provide the current source for maintaining the operating bias for the dual collector current source transistor 14. In the circuit shown in FIG. 2, the transistor 25 and resistor 26 have been eliminated; and the collectors of both of the transistors 31 and 32 of the differential amplifier 30 are connected together and to the collector 16 of the transistor 14 and the base of the transistor 23. In addition, the diode 38 has been eliminated and the bias for the base of the transistor 32 is obtained from the junction of the diodes 17 and 18.

Operation of the circuit of FIG. 2, upon the initial application of power to the bonding pad 22, is the same as the operation described in conjunction with FIG. 1. Current initially flows through the voltage divider consisting of the resistor 39 and the diode 37 to bias the transistor 31 into conduction. This in turn insures commencement of conduction of the current source transistor 14 in the manner described previously. Once current flows out of the collector 15 through the diodes 17, 18 and 19, the higher bias established by the two diode drop across the diodes 18 and 19 applied to the base of the transistor 32 causes that transistor to become conductive; and the transistor 31 becomes nonconductive, as described previously.

When the transistor 32 conducts, it then draws the current from the collector 16 of the transistor 14 and provides the biasing on the base of the transistor 23, which in FIG. 1 was provided by the additional current source transistor 25. In all other respects, the circuit shown in FIG. 2 operates in the same manner as the circuit 10 shown in FIG. 1. The output for the circuit of FIG. 2 is obtained across the three diode drop provided by the diodes 17, 18 and 19 in the same manner as it is provided in the circuit 10 shown in FIG. 1.

The potential obtained across the diodes 17, 18 and 19 is applied to the base of an NPN transistor 40 which supplies the operating bias potential for the operational amplifier circuit 11. The collector of the transistor 40 is coupled to the base of a substrate PNP transistor 42, which operates as a current source starting and biasing transistor for two lateral PNP current source transistors 43 and 45, respectively, with the bases of the transistors 43 and 45 being connected to the emitter of transistor 42.

As the transistor 40 commences conduction, the current for the transistor 40 is supplied from the PNP-current source transistor 43; and in a typical circuit, the parameters of the circuit may be selected to provide 200 microamps of current. This current flows through the collector-emitter path of the transistor 40, through a resistor 47 and a diode 48 to a bonding pad 49, coupled to ground. Similarly, the bias on the base of the PNP current source transistor 45 causes the transistor 45 to supply 200 microamps of current, for the circuit under consideration, to the output stage of the operational amplifier.

Input signals for the amplifier stage 11 are applied to an input bonding pad 51 coupled to the base of an NPN-input transistor 53, the emitter of which is coupled directly to the bonding pad 49, and the collector of which is coupled to the emitter of an additional NPN-transistor 54 cascoded in series with the collector-emitter path of the transistor 53. The base of the transistor 54 is connected to the junction between the emitter of the transistor 40 and the resistor 47, and therefore is provided with a $2\phi$ stabilized biasing potential, which causes the base of the transistor 54 to operate at AC ground. As a consequence, the input gain transistor 53 is provided at its collector with the low value emitter impedance of the transistor 54 as a load impedance. This operates to reduce the gain of the transistor 53 to unity and keeps the collector-base capacitance of the transistor 53 from being multiplied (the Miller effect). If this protection against the amplification of Miller effect is not necessary in a particular circuit application, the transistor 54 and its function could be eliminated from the circuit.

The output stage of the operational amplifier includes a high-beta lateral PNP buffer transistor 57, the base of which is connected to the collector of the transistor 54, if this transistor is used in the circuit, or the base of the transistor 57 may be connected directly to the collector of the transistor 53 if the transistor 54 is not used. The emitter and collector of the high-beta lateral PNP transistor 57 are coupled to the base and emitter, respectively, of a first output NPN-transistor 59. The collector of the transistor 59 is connected to the positive voltage supply terminal at the bonding pad 22, and the junction of the emitter of the transistor 57 with the base of the transistor 59 is connected to the collector of the current source transistor 45, which provides the predetermined operating current of 200 microamps to the emitter of the transistor 57.

The output stage then is completed by a second NPN transistor 60, which is connected as a current source transistor, with the collector coupled to the junction of the emitter of the transistor 59 and the collector of the transistor 57 at an output bonding pad 62 to provide the output signals from the circuit. The emitter of the transistor 60 is connected to the ground bonding pad 49, and the base of the transistor 60 is connected to the junction of the resistor 47 and the diode 48. The diode 48 provides a forward bias for the base-emitter junction of the transistor 60 and further provides temperature compensation for this junction in a well-known manner. For a typical circuit, with 200 microamps of current being provided by the current source transistor 45, the current source transistor 60 could be operating with 1.2 milliamps of current flowing therethrough.

By interconnecting the emitter and collector of the transistor 57 with the base and emitter of the NPN transistor 59, respectively, it should be noted that a type of double emitter-follower output is provided; so that the signal voltage is essentially the same at the base of the transistor 57, the emitter of the transistor 57, and the emitter of the transistor 59 at the output bonding pad 62. As a consequence, the output impedance of the transistor 57 no longer loads the high impedance node at the collector of the NPN gain transistor 53. This result is obtained since the AC signal voltage is of essentially the same magnitude and in-phase on both the collector and base terminals of the transistor 57. This equality of signal across the collector-base junction of the high-beta lateral PNP transistor 57 insures that no AC current will flow from the base to the collector which would have caused loading of the high-impedance node. As a result, it is not necessary to use a Darlington stage at the input or on the output; so that the output peak to peak signal swing is not reduced by the $V_{BE}$ loss of another transistor nor is the input level increased by an additional $V_{BE}$ as it would if a Darlington stage were used.

It should also be noted that the emitter-to-collector biasing voltage of the transistor 57 is held at one $\phi$ (the voltage across one diode junction) by the output of the emitter-follower transistor 59, since the base-emitter junction of the transistor 59 is connected across the emitter-collector of the transistor 57. As a consequence, it is possible for the transistor 57 to be a lateral PNP transistor having a very high beta, even though such a transistor exhibits poor "punch through" characteristics under voltage stress. The improved current gain of the high-beta transistor 57 results in a reduction of the collector current of the transistor 53, which in turn results in a reduction in the input current to the amplifier since the input current is the base current to the transistor 53. In the circuit under consideration a typical input current is 25 nanoamps.

The pair of PNP current source transistors 43 and 45 connected in parallel are used in place of a dual-collector lateral PNP transistor in order to raise the output impedance of the current source 45. This permits a larger open loop voltage gain so that the theoretical voltage gain limit of a single common-emitter amplifier is more closely realized. This gain limit is dependent upon the characteristics of the input amplifier transistor 53.

By the use of the output stage consisting of the high-beta lateral PNP transistor 57 and the NPN transistors 59 and 60, it is possible to obtain an output voltage swing which is equal approximately to the value of the supply potential applied to the terminal 23 minus one volt. The one volt drop takes place in the form of a 0.2 voltage drop across the emitter-collector junction of the transistor 45, a 0.7 voltage drop across the base-emitter junction of the output transistor 59, and a 0.2 voltage drop across the collector-emitter junction of the transistor 60. The addition of the transistor 54 for reducing Miller effect results in only a slight reduction in the total output swing possible from the circuit.

As is common with most operational amplifier circuits, some type of a feedback (not shown) between the output bonding pad 62 and the input bonding pad 51 is provided, with the particular nature of this feedback being determined by the application in which the operational amplifier circuit 11 is to be used. Some possible applications of the basic operational amplifier circuit 11 are to use the amplifier as an AC amplifier with a stable Q point, as a tachometer amplifier (amplifying a sequence of pulse inputs), as a voltage regulator by employing a Zener diode in the feedback circuit, and the like.

In many applications of operational amplifiers, it is desirable to provide inverting inputs and noninverting inputs to permit an even greater range of applications of the basic circuit. Referring to FIG. 3 there is shown a modification of the operational amplifier circuit 11 in which all of the similar components are provided with the same reference numerals used to identify the components in the amplifier circuit 11 of FIG. 1. The circuit of FIG. 3 has been modified, however, by the addition of a noninverting input, which is obtained by an additional NPN transistor 70 and a diode 71. The collector of the transistor 70 is connected to the inverting input at the base of the input transistor 53, with the emitter of the transistor 70 being connected to the grounded bonding pad 49. In all other respects, the amplifier circuit 11 shown in FIG. 3 operates in the same manner as the comparable circuit shown in FIG. 1, with the exception that the two inputs provided to the circuit shown in FIG. 3 increase the applications of the circuit since it then may be used as a comparator, as a difference tachometer, etc.

Once the regulated biasing voltage or operating voltage for the differential amplifier 11 is provided by the biasing circuit 10, this same biasing voltage may be utilized to provide an operating biasing potential to a plurality of differential amplifier circuits, with an additional circuit 12 being shown in FIG. 1. The differential amplifier circuit 12 is similar in all respects to the differential amplifier 11 and has input signals applied to an input bonding pad 81 and obtained from an output bonding pad 82, which are comparable to the bonding pads 51 and 62 shown for the circuit 11.

The biasing potential obtained from the junction of the collector of the transistor 15 and the diode 17 is applied in the circuit 12 to a transistor comparable to the transistor 40 shown in the circuit 11. The use of transistors such as the transistor 40 insures that if any of the amplifiers 11, 12, etc. being supplied with operating potential from the circuit 10 saturates, that is goes as far toward ground as possible or as far toward the positive voltage supply as possible, the saturation of a particular amplifier stage does not affect or introduce any extraneous signals into the other operational amplifier circuits which are sharing the common bias voltage obtained from the circuit 10. If the current sources of the amplifier circuits 11 and 12 were driven directly from the same reference point without using the transistor 40, the saturation of one of these current sources would disturb the operation of the current source in the other amplifiers. This would result since the current gain (beta) of a transistor falls toward unity when the transistor is saturated and this increases the input (base) current. Such a sudden increase in base current could load the bias reference line and cause the voltage to fall, which then would affect the rest of the current source transistors which are in the other differential amplifier circuits.

By providing separate current source transistors, such as the transistors 43 and 45, in each operational amplifier circuit 11 and 12 and biasing each of these current sources in turn by a separate NPN transistor, such as the transistor 40, off the common bias line from the circuit 10, the undesirable coupling from one operational amplifier to the other under saturation conditions of a current source in one of the operational amplifiers is prevented. Although only two stages of operational amplifiers 11 and 12 are shown supplied with common biasing from the circuit 10, additional amplifier circuits similar to the circuits 11 and 12 also could be operated from the same biasing circuit if so desired.

I claim:

1. A circuit for providing a reference direct current potential from a direct current supply including in combination:

first and second voltage supply terminals adapted to be connected across a direct current potential source;

a first current source and first resistive impedance means connected in series in the order named between the first and second voltage supply terminals;

a differential amplifier switching circuit including first and second transistors each having base, collector, and emitter electrodes, with the emitters coupled together with the second voltage supply terminal, the collector of at least the first transistor being coupled with the first current source for biasing the first current source into conduction with the first transistor being rendered conductive;

voltage divider means coupled between the first and second voltage supply terminals and having a tap connected to the base of the first transistor for biasing the first transistor into conduction with a potential initially being applied between the first and second voltage supply terminals;

means coupling the base of the second transistor with the first impedance means, the potential established on the base of the second transistor with current flowing through the first impedance means from the first current source being sufficient to bias the second transistor into conduction, rendering the first transistor nonconductive so long as potential continues to be applied between the first and second voltage supply terminals; and means coupled with the first impedance means for maintaining first current source conductive responsive to a predetermined potential established by current flowing from the first current source through the first impedance means.

2. The combination according to claim 1 wherein the collectors of the first and second transistors are coupled together to the first current source for biasing the first current source into conduction with either the first or second transistors being rendered conductive.

3. The combination according to claim 2 including an additional current source coupled between the first voltage supply terminal and the collectors of the first and second transistors of the differential amplifier switching circuit.

4. The combination according to claim 3 wherein the first and additional current sources comprise a double-collector PNP transistor, having first and second collectors, with the first collector thereof being coupled with the first resistance means and the second collector being coupled with the collectors of the first and second transistors of the differential amplifier switching circuit; the combination further including a fourth PNP transistor having base, emitter, and collector electrodes, with the emitter thereof coupled with the base of the double collector PNP transistor, the collector thereof being coupled with the second voltage supply terminal, and the base thereof being coupled in common with the collectors of the first and second transistors and with the means for maintaining the first current source conductive.

5. The combination according to claim 1 wherein the first resistive impedance means includes a predetermined number of diode junctions connected in series between the base of the second transistor and the second voltage supply terminal, and the voltage divider means includes resistance means and a second predetermined number of diode junctions connected in series in the order named between the first and second voltage supply terminals and interconnected at the tap, the second predetermined number of diode junctions being less than the first predetermined number of diode junctions.

6. The combination according to claim 1 wherein the first current source includes a control input and the means for maintaining the first current source conductive includes a second current source transistor having base, collector, and emitter electrodes, with the base electrode coupled with the first resistive impedance means, the emitter thereof coupled with the second voltage supply terminal, and the collector thereof coupled with the control input of the first current source.

7. The combination according to claim 6 wherein the first current source includes a first current source transistor having base, collector, and emitter electrodes, with the emitter thereof coupled with the first voltage supply terminal, the collector thereof coupled with the first resistive impedance means, and the base thereof coupled with the collector of the second current source transistor.

8. The combination according to claim 7 wherein the first and second differential switching circuit transistors and the second current source transistor are of one conductivity type and the first current source transistor is of opposite conductivity type.

9. The combination according to claim 8 including a third current source coupled between the first voltage supply terminal and the collector of the first transistor of the differential amplifier switching circuit.

10. The combination according to claim 9 wherein the first and third current sources include a double-collector PNP transistor, having first and second collectors, with the first collector being coupled with the first resistance means and the second collector being coupled with the collector of the first transistor of the differential amplifier switching circuit, the combination further including a fourth PNP transistor having base, emitter and collector electrodes, with the emitter thereof coupled with the base of the double-collector PNP transistor, the collector thereof being coupled with the second voltage supply terminal, and the base thereof being coupled in common with the collector of the first transistor of the differential amplifier switching circuit and the collector of the second current source transistor.

11. A monolithic integrated amplifier circuit including in combination:

first and second supply terminals adapted to be connected across a source of operating potential;

a first current source and first resistive impedance means connected in series in the order named between the first and second voltage supply terminals;

a differential amplifier switching circuit including first and second transistors, each having base, collector, and emitter electrodes, with the emitters coupled together with the second voltage supply terminal, the collector of at least the first transistor being coupled with the first current source for biasing the first current source into conduction with the first transistor being rendered conductive;

voltage divider means coupled between the first and second voltage supply terminals and having a tap connected to the base of the first transistor for biasing the first transistor into conduction with a potential initially being applied between the first and second voltage supply terminals;

means coupling the base of the second transistor with the first impedance means, the potential established on the base of the second transistor with current flowing through the first impedance means from the first current source being sufficient to bias the second transistor into conduction, rendering the first transistor nonconductive so long as potential continues to be applied between the first and second voltage supply terminals;

an NPN signal input transistor having collector, base and emitter electrodes;

a first NPN output transistor having collector, base, and emitter electrodes;

a PNP buffer transistor having collector, base, and emitter electrodes;

means coupling the collector-emitter path of the first output transistor in a series circuit between the first and second supply terminals, with said series circuit having a tap thereon constituting an output terminal, the emitter of the buffer transistor being coupled with the base of the output transistor, the collector of the buffer transistor being coupled with the emitter of the output transistor, and the base of the buffer transistor being coupled with the collector of the input transistor, the emitter of the input transistor being coupled with said second voltage supply terminals;

means for providing operating current for said first NPN output transistor;

means coupled with the first impedance means for supplying a biasing potential to said means for providing operating current; and means for supplying input signals to the base of said input transistor.

12. The combination according to claim 11 wherein the PNP buffer transistor is a high beta lateral PNP transistor and the connection between the collector of the buffer transistor and the emitter of the first NPN output transistor is the sole connection to the collector of the PNP buffer transistor.

13. The combination according to claim 11 further including a second NPN output transistor having base, collector and emitter electrodes, with the collector-emitter paths of the first and second NPN output transistors being coupled in series between said first and second supply terminals at a first junction between the emitter of the first output transistor and the collector of the second transistor, with the collector of the first output transistor being connected with the first voltage supply terminal and the emitter of the second output transistor being connected with the second voltage supply terminal;

said means for supplying a biasing potential being coupled with the base of the second output transistor.

14. The combination according to claim 13 further including a third current source connected between the first voltage supply terminal and a junction formed by the connection of the emitter of the buffer transistor with the base of the first output transistor.

15. The combination according to claim 14 wherein the means for supplying a bias potential is coupled to the base of the second output transistor to supply a stabilized DC biasing potential thereto causing the second output transistor to operate as a fourth current source, and the means for supplying a bias potential also is coupled with the third current source for stabilizing the operation thereof.

* * * * *